United States Patent [19]

West et al.

[11] Patent Number: 4,828,965

[45] Date of Patent: May 9, 1989

[54] AQUEOUS DEVELOPING SOLUTION AND ITS USE IN DEVELOPING POSITIVE-WORKING PHOTORESIST COMPOSITION

[75] Inventors: Richard J. West, Narragansett; Stephen F. Marcotte, Jr., Pawtucket; Faris A. Modawar, Greenville, all of R.I.

[73] Assignee: Olin Hunt Specialty Products Inc., Palisades Park, N.J.

[21] Appl. No.: 141,136

[22] Filed: Jan. 6, 1988

[51] Int. Cl.$^4$ .......................... G03C 5/18; G03C 5/00
[52] U.S. Cl. ..................... 430/309; 430/325; 430/331
[58] Field of Search ............... 430/309, 331, 325; 252/135, 525

[56] References Cited

U.S. PATENT DOCUMENTS

| | | | |
|---|---|---|---|
| 4,053,314 | 10/1977 | Kimura et al. | 96/49 |
| 4,174,304 | 11/1979 | Flanagan | 252/524 |
| 4,191,569 | 3/1980 | Lawson | 430/305 |
| 4,191,573 | 3/1980 | Toyama et al. | 430/166 |
| 4,221,858 | 9/1980 | Shiba et al. | 430/266 |
| 4,359,520 | 11/1982 | Carothers et al. | 430/326 |
| 4,366,224 | 12/1982 | Hsieh | 430/149 |
| 4,370,404 | 1/1983 | Tachikawa et al. | 430/302 |
| 4,411,981 | 10/1983 | Minezaki | 430/299 |
| 4,732,840 | 3/1988 | Hasegawa | 430/302 |

FOREIGN PATENT DOCUMENTS

| | | |
|---|---|---|
| 124297A | 11/1984 | European Pat. Off. . |
| 3338338 | 4/1984 | Fed. Rep. of Germany . |
| 58-82243 | 5/1983 | Japan . |
| 60-158461 | 8/1985 | Japan . |
| 691799 | 10/1979 | U.S.S.R. . |
| 1405558 | 9/1975 | United Kingdom . |

*Primary Examiner*—Paul R. Michl
*Assistant Examiner*—Patrick A. Doody
*Attorney, Agent, or Firm*—William A. Simons

[57] ABSTRACT

An aqueous developing solution useful in developing positive-working photoresists comprising:

| | | |
|---|---|---|
| A. | Soluble Alkali Metal Phosphate | 1.50–3.00% by weight |
| B. | Soluble Alkali Metal Silicate | 1.00–2.00% by weight |
| C. | Mono (lower alkanol) amine | 0.40–5.00% by weight |
| D. | Soluble Alkylene Glycol | 0.25–3.00% by weight |
| E. | Lower Alkanol | 0.05–1.00% by weight |
| F. | Water | Balance to 100% by weight |

17 Claims, No Drawings

AQUEOUS DEVELOPING SOLUTION AND ITS USE IN DEVELOPING POSITIVE-WORKING PHOTORESIST COMPOSITION

BACKGROUND OF THE INVENTION

1. Field of the Invention

The present invention relates to an aqueous developing solution and its use in providing improved development of positive-working photoresist compositions.

2. Description of Related Art

Photoresist compositions are used in microlithography processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum lithographic printing plates or copper plates of printed wiring boards. The coated substrate is then baked to evaporate any solvent in the photoresist composition and to fix the coating onto the substrate. The baked coated surface of the substrate is next subjected to an imagewise exposure of radiation. This radiation exposure causes a chemical transformation in the exposed areas of the coated surface. Visible light, ultraviolet (UV) light, electron beam and X-ray radiant energy are radiation types commonly used today in microlithographic processes. After this imagewise exposure, the coated substrate is treated with a developer solution to dissolve and remove either the radiation-exposed or the unexposed areas of the coated surface of the substrate.

There are two types of photoresist compositions—negative-working and positive-working. When negative-working photoresist compositions are exposed imagewise to radiation, the areas of the resist composition exposed to the radiation become less soluble to a developer solution (e.g. a cross-linking reaction occurs) while the unexposed areas of the photoresist coating remain relatively soluble to a developing solution. Thus, treatment of an exposed negative-working resist with a developer causes removal of the non-expsed areas of the resist coating and the creation of a negative image in the photoresist coating, and thereby uncovering a desired portion of the underlying substrate surface on which the photoresist composition was deposited. On the other hand, when positive-working photoresist compositions are exposed imagewise to radiation, those areas of the resist composition exposed to the radiation become more soluble to the developer solution (e.g. a rearrangement reaction occurs) while those areas not exposed remain relatively insoluble to the developer solution. Thus, treatment of an exposed positive-working resist with the developer causes removal of the exposed areas of the resist coating and the creation of a positive image in the photoresist coating. Again, a desired portion of the underlying substrate surface is uncovered.

After this development operation, the now partially unprotected substrate may be treated with a substrate-etchant solution or plasma gases and the like. This etchant solution or plasma gases etch the portion of the substrate where the photoresist coating was removed during development. The areas of the substrate where the photoresist coating still remains are protected and, thus, an etched pattern is created in the substrate material which corresponds to the photomask used for the imagewise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

Positive-working photoresist compositions are currently favored over negative-working resists because the former generally have better resolution capabilities and pattern transfer characteristics.

Photoresist resolution is defined as the smallest feature which the resist composition can transfer from the photomask to the substrate with a high degree of image edge acuity after exposure and development. In many manufacturing applications today, resist resolution on the order of one micron or less are necessary.

In addition, it is generally desirable that the developed photoresist wall profiles be near vertical relative to the substrate and no resist residue be present on the substrate surface on the exposed and developed areas. Such demarcations between developed and undeveloped areas of the resist coating translate into accurate pattern transfer onto the substrate.

The formation of a latent image on the photoresist coating by the imagewise exposure of the coating with radiant energy and the conversion of this latent image to a suitable relief image on the coating by the developer solution may be dependent upon several processing variables, including:

1. Photoresist coating thickness
2. Photoresist soft baking temperature
3. Radiant Energy Type (e.g., UV light or electron beam current)
4. Radiant Energy Amount
5. Developer Type
6. Developer Concentration
7. Development Temperature
8. Development Time
9. Development Mode (e.g., immersion or spray or both)

These parameters are frequently played against each other to balance the sometimes-conflicting goals of the overall microlithographic operation (e.g. amount of throughput, degree of image dimension control and resolution desired as well as process latitude). This parameter balancing may be aided in the case of positive-working photoresist coating if a developer solution is selected which has a rapid dissolution rate of the exposed areas of the resist coating while relatively unaffecting the unexposed areas of the resist as well as also providing good image quality, developed image dimension (DID) control and process latitude.

In the past, numerous aqueous developing solutions have been known in the photoresist art for use with positive-working resist coatings. Generally, there are three classes of these developing solutions. They are metal-containing developers, metal ion-free developers and organic solvent developers.

Known metal-containing developers include aqueous solutions of alkali metal salts such as alkali metal hydroxides, alkali metal phosphates, and alkali metal silicates and mixtures thereof. One known metal-containing developer contains the combination of trisodium phosphate sodium metasilicate in water. Known metal ion-free developers include aqueous solutions of quaternary ammonium hydroxides such as tetramethylammonium hydroxide. Known alkaline organic solvent developers include solutions of alkaline organic solvents such as mono lower alkanol amines, alkylene glycols and the lower alkyl alcohols. One known alkaline organic solvent-containing developer is made up of the combination of monoethanolamine, ethylene glycol and isopropyl alcohol.

Organic solvent developers are not favored over the two other developer types for most applications because they are very sensitive to temperature changes, thereby causing inconsistent lithographic performance. However, alkali-metal containing developers, while very stable under most processing conditions and providing relatively high resolution, have the disadvantage of leaving alkali metal ion residues which may be detrimental in some processes. Metal ion-free developers have the disadvantage of being too aggressive, thus not obtaining high resolution for certain applications.

In electron beam exposure processes and some UV light exposure processes, an aggressive development with high selectivity is needed. None of these known type developers meet this need. Accordingly, the present invention is a solution to this need.

BRIEF SUMMARY OF THE INVENTION

Accordingly, the present invention is directed at an aqueous developing solution comprising:

| A. | Soluble Alkali Metal Phosphate | 1.50–3.00% by weight |
|---|---|---|
| B. | Soluble Alkali Metal Silicate | 1.00–2.00% by weight |
| C. | Mono (lower alkanol) amine | 0.40–5.00% by weight |
| D. | Soluble Alkylene Glycol | 0.25–3.00% by weight |
| E. | Lower Alkanol | 0.05–1.00% by weight |
| F. | Water | Balance to 100% by weight |

The present invention is also directed to a method of developing an imagewise-exposed layer of positive-working photoresist composition (preferably comprising a novolak-type resin and a diazoketone photosensitive agent), which comprises:

contacting said layer with an aqueous developing solution comprising the above formulation.

The use of developer solutions of the present invention with lithographic applications such as with optical-/UV light sources or high energy sources, e.g., electron beam current, have shown improved photospeed/sensitivity, high developer selectivity, low film loss of the unexposed areas, very good image quality and wide process latitude.

DETAILED DESCRIPTION

It is believed that any conventional positive-working photoresist formulation may be developed with the above-noted developer formulation of the present invention. Generally, photoresist formulations are made up of an alkali-soluble resin component and a photosensitive agent component, both dissolved in a compatible solvent.

One preferred type of alkali-soluble resin for positive-working photoresists is a novolak-type resin such as cresol-formaldehyde novolaks or phenolformaldehyde novolaks. Particularly preferred are mixed isomer cresol-formaldehyde novolaks. An example of such a resin is described in U.S. Pat. No. 4,377,631 (Toukhy), which is incorporated herein by reference in its entirety.

The preferred class of photosensitive agents is diazoketones which are relatively insoluble in aqueous alkaline solutions and sensitive to radiation in the ultraviolet region of the light spectrum or to electron beam or x-ray radiation and forming, when exposed to such radiation, decomposition products which are relatively soluble in aqueous alkaline solutions. Diazoketone compounds which are particularly suitable for the practice of the present invention include naphthoquinone diazides such as naphthoquinone-1,2-diazide-5-sulfonic acid esters of trihydroxybenzophenones.

The most preferred photoresist compositions are formed by adding the novolak-type resin and the diazoketone photosensitive agent to a solvent in which all of the components of the photoresist are readily soluble. The order of addition to the solvent is generally not critical. The solvent may be any of the solvents conventionally used to dissolve photoresist compositions for coating purposes. These include ethyl lactate, aliphatic alkylene glycol alkyl ethyl esters, cyclohexanone, methyl cellosolve acetate, ethyl cellosolve acetate, butyl acetate, xylene and mixtures thereof. A particularly preferred solvent is ethyl lactate or a mixture of ethyl cellosolve acetate, butyl acetate and xylene. The choice of solvent will depend on the specific novolak-type resin and specific diazoketone employed.

The solids content (i.e., non-solvent ingredients) of the photoresist formulation before coating may vary broadly, but it is preferable to have a total solids content in the range of from about 10 to about 55 percent by weight, based on the total photoresist weight. The resin component is preferably from about 60 to about 95 percent by weight of the total solids content. The photosensitive agent component is preferably from about 30 to about 5 percent by weight of the total solids content.

After the novolak-type resin and diazoketone have been added to the solvent, the mixture is agitated until all solids are dissolved. The resultant photoresist solution is microfiltered, preferably using a microfiltration system under a nitrogen, or other inert, oxygen-free atmosphere.

Conventional photoresist additives such as dyes, anti-striation agents, plasticizers, adhesion promoters, speed enhancers and non-ionic surfactants in individual quantities up to about 5% by weight each may preferably be added to the photoresist formulation before it is filtered.

The filtered photoresist composition can be applied to a suitable substrate or support by any conventional method known to those skilled in the art, including dipping, spraying, whirling and spin coating. The coated substrate or support can then be imagewise-exposed to radiation (e.g. UV or electron beam or other high energy light sources) in any known manner.

The exposed, photoresist coated substrate is then contacted with an aqueous alkaline developing solution of the present invention. This method of contacting is preferably carried out by immersing the coated substrate in a bath of the developing solution, for example, a Teflon tank until all of the photoresist coating has been dissolved from the imagewise-exposed areas. The solution preferably agitated, for example, by nitrogen burst agitation.

Alternative developing modes such as spray, puddle or mechanical agitation development may be employed instead. The specific development process parameters (e.g. development time and temperature) will depend upon the specific type of photoresist employed, specific developer concentrations and particular mode of development employed. Development temperatures in the range of about 20° C. to 30° C. and development times from about 60 seconds to 840 seconds are suitable for most immersion applications.

Any alkali metal phosphate salt which is soluble in an aqueous alkaline developer solution may be used. The preferred alkali metals are sodium and potassium. The most preferred soluble alkali metal phosphate is sodium triphosphate.

Any alkali metal silicate which is soluble in an aqueous alkaline developing solution may be used. The preferred alkali metals are again sodium and potassium. The most preferred soluble alkali metal silicate is sodium metasilicate.

Any mono (lower alkanol) amine which is soluble in an aqueous alkaline developer solution may be used. The term lower alkanol is used to mean any alcohols having 1–4 carbon atoms. The most preferred mono (lower alkanol) amine is monoethanolamine.

Any alkylene glycol which is soluble in an aqueous alkaline developer solution may be used. The most preferred alkylene glycol is ethylene glycol.

Any lower alkanol which is soluble in an aqueous alkaline developing solution may be used. The term lower alkanol is used to mean any alcohols having 1–4 carbon atoms. The most preferred lower alkanol is isopropyl alcohol.

The preferred concentration of each developer ingredient of the present invention will depend on the particular ingredient used, the process parameters employed and the particular type and thickness of photoresist used. For many development operations, the preferred ranges of the above-noted most preferred ingredients are as follows:

| | | |
|---|---|---|
| A. | Trisodium phosphate | 1.8–2.50% by weight |
| B. | Sodium Metasilicate | 1.2–1.8% by weight |
| C. | Monoethanolamine | 1.50–3.50% by weight |
| D. | Ethylene Glycol | 1.00–2.25% by weight |
| E. | Isopropyl Alcohol | 0.20–0.70% by weight |
| F. | Water | Balance to 100% by weight |

The aqueous alkaline developing solution can optionally contain various other standard developer ingredients that are known to those having ordinary skill in this art. For example, the developing solution may also include stabilizers such as disodium ethylenediamine tetraacetic acid ($Na_2EDTA$) in amounts of less than about 0.2% by weight or an alkaline-soluble antioxidant in amounts of less than 0.1% by weight, based on the total weight of the developing solution. Another optional ingredient is phloroglucinol which may be present in amounts less than about 0.1% by weight of the total developer solution.

It also should be apparent to those skilled in the art that an aqueous concentrate of the developing solution of the present invention can be prepared which can be diluted with more water prior to use as the developing solution. This concentrate may be advantageous in that it would reduce the amount of water which must be stored or shipped.

By employing the above-noted combination of developing ingredients on an aqueous solution, the exposed areas of the positive-working photoresist composition are removed by the aqueous developing composition while the unexposed areas are relatively unaffected. Thus, the exposed areas of the photoresist may be removed without leaving a residue between the edges or surfaces of the unexposed areas and the substrate.

The following examples are provided to illustrate the invention. All parts and percentages are by weight unless otherwise noted.

EXAMPLES

The following procedure was followed in each of the examples and comparative examples with the use of two types of exposure systems: a broad band UV light source and a 10KV and 20KV electron beam current.

In all of the following examples and comparative examples, the photoresist compositions that were employed are commercially available under the designations "HPR-204" and "HEBR-214" from Olin Hunt Specialty Products, Inc., West Paterson, N.J., and both contain a mixed isomer cresol-formaldehyde novolak resin and, as a photosensitive agent, a naphthoquinone-1,2-diazide-5-sulfonic acid ester of a trihydroxybenzophenone.

EXPOSURE TO UV LIGHT SOURCE

Several 4 inch diameter silicon wafers which had a 6000Å silicon oxidized surface layer and had hexamethyldisilazane (HMDS) applied thereto were employed herein. Each of these wafers were spin coated with HPR-204 positive-working photoresist to provide a film thickness of 1 micron. The coated wafers were then softbaked at 100° C.–105° C. for 30 minutes in a BLUE M convection oven. The soft-baked wafers were then exposed through a focus wedge photomask on a Perkin Elmer Micralign 340 broad band exposure system (at UV 4 mode). These imagewise exposed wafers were developed for 60 seconds each at 22° C.±1° C. by an immersion process with different aqueous developer solutions as shown below as Examples 1, 2, 4 and 5 and Comparisons 1–5. After developing, the wafers were inspected and analyzed as indicated below.

EXPOSURE TO ELECTRON BEAM CURRENT

Several 4-inch diameter silicon wafers which had a 6000Å silicon oxide surface layer and had HMDS applied thereto and several 4-inch square photomasks (made of low expansion glass with 950Å of oxidized chromium surface film thereon) were employed in these experiments. The silicon wafers were first spin coated wih 1.0-micron layer of HEBR-214 positive-working photoresist and the photomasks were each spin coated with a 0.5 micron layer of HEBR-214 photoresist. The coated wafers and photomasks were then soft baked at 100° C.±5° C. for 30 minutes in a BLUE M convection oven. The softbaked wafer and photomasks were then separately exposed to an electron beam current in JEOL E-Beam system. The beam current for the wafers was 20KV and the beam current for the photomasks was 10KV. A relief image was produced on both the wafers and photomask of predefined patterns. These imagewise exposed wafers and photomasks were individually developed for 240 seconds at 22° C.±1° C. by an immersion process with different developer solutions as shown below as Examples 1–5 and Comparsons 1, 2 and 4. After developing, the wafers and photomasks were inspected and analyzed as indicated below.

EXAMPLE 1

| Developer Ingredient | Amount % by Weight |
|---|---|
| Trisodium Phosphate | 2.14 |

-continued

| Developer Ingredient | Amount % by Weight |
|---|---|
| Sodium Metasilicate | 1.53 |
| Na$_2$EDTA | 0.09 |
| Monoethanolamine | 1.73 |
| Ethylene Glycol | 1.13 |
| Isopropyl Alcohol | 0.30 |
| Water | 93.08 |
| | 100.00 |

EXAMPLE 2

| Developer Ingredient | Amount % by Weight |
|---|---|
| Trisodium Phosphate | 2.00 |
| Sodium Metasilicate | 1.43 |
| Na$_2$EDTA | 0.08 |
| Monoethanolamine | 3.24 |
| Ethylene Glycol | 2.12 |
| Isopropyl Alcohol | 0.57 |
| Water | 90.56 |
| | 100.00 |

EXAMPLE 3

| Developer Ingredient | Amount % by Weight |
|---|---|
| Trisodium Phosphate | 2.00 |
| Sodium Metasilicate | 1.43 |
| Na$_2$EDTA | 0.08 |
| Monoethanolamine | 3.24 |
| Ethylene Glycol | 2.12 |
| Isopropyl Alcohol | 0.57 |
| Phloroglucinol | 0.013 |
| Alkaline-soluble antioxidant | 0.003 |
| Water | 90.544 |
| | 100.000 |

EXAMPLE 4

| Developer Ingredient | Amount % by Weight |
|---|---|
| Trisodium Phosphate | 2.25 |
| Sodium Metasilicate | 1.61 |
| Monoethanolamine | 0.49 |
| Ethylene Glycol | 0.32 |
| Isopropyl Alcohol | 0.09 |
| Na$_2$EDTA | 0.09 |
| Water | 95.15 |
| | 100.00 |

EXAMPLE 5

| Developer Ingredient | Amount % by Weight |
|---|---|
| Trisodium Phosphate | 2.22 |
| Sodium Metasilicate | 1.58 |
| Monoethanolamine | 0.84 |
| Ethylene Glycol | 0.55 |
| Isopropyl Alcohol | 0.14 |
| Na$_2$EDTA | 0.09 |
| Water | 94.58 |
| | 100.00 |

COMPARISON 1

| Developer Ingredient | Amount % by Weight |
|---|---|
| Monoethanolamine | 24.80 |
| Ethylene Glycol | 16.28 |
| Isopropyl Alcohol | 4.40 |
| Water | 54.52 |
| | 100.00 |

COMPARISON 2

| Developer Ingredient | Amount % by Weight |
|---|---|
| Trisodium Phosphate | 4.60 |
| Sodium Metasilicate | 3.28 |
| Na$_2$EDTA | 0.19 |
| Water | 91.93 |
| | 100.00 |

COMPARISON 3

| Developer Ingredient | Amount % by Weight |
|---|---|
| Trisodium Phosphate | 4.44 |
| Sodium Metasilicate | 3.17 |
| Monoethanolamine | 3.38 |
| Na$_2$EDTA | 0.18 |
| Water | 88.83 |
| | 100.00 |

COMPARISON 4

| Developer Ingredient | Amount % by Weight |
|---|---|
| Trisodium Phosphate | 4.38 |
| Sodium Metasilicate | 3.12 |
| Monoethanolamine | 4.76 |
| Na$_2$EDTA | 0.18 |
| Water | 87.56 |
| | 100.00 |

COMPARISON 5

| Developer Ingredient | Amount % by Weight |
|---|---|
| Trisodium Phosphate | 4.18 |
| Sodium Metasilicate | 2.98 |
| Monoethanolamine | 9.09 |
| Na$_2$EDTA | 0.17 |
| Water | 83.58 |
| | 100.00 |

The developed wafers and photomasks of the above experiments were measured for film loss, photospeed and in some instances resolution. The image quality of the developed photoresist layers on both the wafers and photomasks were observed and these observations are given.

To measure film loss, the photoresist film (e.g. the unexposed portion) was measured after the softbake step and after development. The difference in the two values is the film loss. The lower the film loss, the higher the contrast between exposed and unexposed images. To measure the film loss in UV light exposure experiments, a Dektak II A surface profilometer (with 12.5 grams of stylus weight) was used. To measure the film loss in electron beam exposure experiments, a Rudolph film thickness monitor (at 1.63 resist refractive index) was used. The results of these film loss measurements are given in Table I.

TABLE I

| Developer Example or Comparison | Film Loss Measurement | |
|---|---|---|
| | UV Exposure Film Loss (Å) | Electron Beam Exosure Film Loss (Å) |
| 1 | −93 | −250 |
| 2 | +197 | −400 |
| 3 | — | −600 |
| 4 | +270 | −800 |
| 5 | +187 | −600 |
| C-1 | −10000 | −10000 |
| C-2 | 0 | −2000 |
| C-3 | −108 | — |
| C-4 | −356 | −1800 |
| C-5 | −1000 | — |

The data in the UV exposure column of Table 1 indicates that the developers of Examples 1, 2, 4 and 5 all have a very low and acceptable film loss (i.e., less than 10% of the original film, 1.0 micron or 10,000 Angstroms). Please note the accuracy of the instrument was ±200Å. The organic solvent developer of Comparison 1 was overly aggressive and caused a complete removal of all original film (i.e., in both exposed and non-exposed areas). The metal-containing aqueous developer of Comparison 2 showed no film loss. Comparisons 3-5 show that increasing concentrations of monoethanolamine (MEA) increase the film loss until the film loss is unacceptable (i.e., 10% of the original film or 1000Å).

The data in the Electron Beam Column of Table 1 shows that the developers of Examples 1, 2, 4 and 5 all have very low and acceptable film loss for the photoresist coating on the wafers (i.e., less than 10% of the original film—1.0 micron or 10000Å). The developers of Examples 1, 2, 4 and 5 also have a very low and acceptable film loss for the photomask coating (i.e., less than 20% of the original coating—0.5 micron or 5000Å). In contrast, the developers of Comparisons 1, 2 and 4 are unacceptable for both wafer and photomask developing.

It was observed in the film loss measurements of the electron beam current-exposed wafers and photomasks with the developers of Examples 1-5 that the bulk of the film loss in unexposed areas occurred in the first 60 seconds of the 240 second development time. In contrast, it was observed that the developers of the Comparisons 1, 2, and 4 likewise tested showed a linear development rate over the whole period. The different development modes between the Examples and Comparisons indicate that developing solutions of present invention have a greater selectivity between the exposed and unexposed areas (this resulting in greater contrast and better critical dimension control and image profiles). The minor modifications between Examples 1-5 and their corresponding similar film loss results in both the UV and electron beam exposure modes indicate that the developers of present invention have good development latitude.

The photospeed values in the UV mode and the sensitivity values in the electron beam mode were determined for the developing solutions of the above Examples and Comparisons. The results are shown in Table II.

TABLE II

| | Developer Photospeed and Sensitivity | | |
|---|---|---|---|
| Example or Comparison | Photospeed (mj/cm²) | Sensitivity (uC/cm²) | |
| | | wafer | photomask |
| 1 | 108 | 16 | 8 |
| 2 | 90 | 14 | 7 |
| 3 | N.T. | 12 | 6 |
| 4 | 119.6 | N.T. | N.T. |
| 5 | 115.4 | N.T. | N.T. |
| C-1 | N.M. | N.M. | N.M. |
| C-2 | 125 | 24 | 12 |
| C-3 | 82 | N.T. | N.T. |
| C-4 | 70.2 | N.T. | N.T. |
| C-5 | 40 | N.T. | N.T. |

N.M. = Not Measurable
N.T. = Not Tested

With photospeed values, the lower the value, the higher the throughput (meaning you can process more wafers per hour and the overall operation is more economical). It is recognized that the photospeed values of Examples 1, 2, 4 and 5 are somewhat higher than Comparisons 3-5, yet they are within acceptable range for most conventional UV exposure operations. It is noted that the Comparison 1 developer could not be measured because the developer totally removed the photoresist coating. It is known from previous experience that conventional UV photospeeds are related to electron beam sensitivities.

With sensitivity values, again the lower the values, the higher the throughput. Thus, electron beam exposure operations desire the lowest possible developer sensitivity for both wafers and photomasks. As shown in Table II, Examples 1, 2, 3 all have acceptable sensitivities. In particular, Example 3 has a very good sensitivity value. It is believed that this resulted from the addition of the small amount of phloroglucinol to the developer.

The image quality of the developed coatings were also observed through an optical microscope and by a scanning electron microscope. Residue in the exposed and developed areas was examined as well as the image profile. These observations were graded on a scale from 1-5 with 1 representing a photoresist which had much residue in developed areas or unacceptable poor image profile; with 2 representing a photoresist with little residue and a below average profile (low contrast), and with 3 representing no residue and average profile (average contrast); with 4 representing no residue and an above average profile (improved contrast); and with 5 representing no residue and very high profile (high contrast). The observations for each developer are given in Table III. The wafers and photomasks were grouped together for each electron beam developer.

TABLE III

| | Image Quality Observations | |
|---|---|---|
| Examples and Comparisons | UV Exposure | Electron Beam Exposure |
| 1 | 4 | 4 |
| 2 | 4 | 5 |
| 3 | N.T. | 4 |
| 4 | 3 | N.T. |
| 5 | 3 | N.T. |
| C-1 | N.M. | N.M. |
| C-2 | 3 | 3 |
| C-3 | 3 | N.T. |

TABLE III-continued

| Image Quality Observations | | |
|---|---|---|
| Examples and Comparisons | UV Exposure | Electron Beam Exposure |
| C-4 | 2 | N.T. |
| C-5 | 2 | N.T. |

N.T. = Not Tested
N.M. = Not Measurable

As can be seen from the values in Table III, each of the developers of the Examples had above average image quality for both exposure modes.

The resolution of the wafers exposed with the electron beam system was observed. It was seen with the scanning electron microscope that high quality, submicron features with high aspect ratios are achievable.

What is claimed is:

1. An aqueous developing solution comprising:

| A. | Soluble Alkali Metal Phosphate | 1.50–3.00% by weight |
|---|---|---|
| B. | Soluble Alkali Metal Silicate | 1.00–2.00% by weight |
| C. | Mono (lower alkanol) amine | 0.40–5.00% by weight |
| D. | Soluble Alkylene Glycol | 0.25–3.00% by weight |
| E. | Lower Alkanol | 0.05–1.00% by weight |
| F. | Water | Balance to 100% by weight |

2. The developing solution of claim 1 additionally comprising 0%–0.2% by weight disodium ethylenediamine tetraacetic acid.

3. The developing solution of claim 1 additionally comprising 0%–0.1% by weight phloroglucinol.

4. The developing solution of claim 1 wherein said soluble alkali metal phosphate is a soluble sodium or potassium phosphate and said soluble alkali metal silicate is a soluble sodium or potassium silicate.

5. The developing solution of claim 1 wherein said soluble alkali metal phosphate is sodium trisodium phosphate.

6. The developing solution of claim 1 wherein said soluble alkali metal silicate is sodium metasilicate.

7. The developing solution of claim 1 wherein said mono (lower alkanol)-amine is monoethanolamine.

8. The developing solution of claim 1 wherein said soluble alkylene glycol is ethylene glycol.

9. The developing solution of claim 1 wherein said lower alkanol is isopropyl alcohol.

10. An aqueous developing solution comprising:

| A. | Trisodium phosphate | 1.80–2.50% by weight |
|---|---|---|
| B. | Sodium Metasilicate | 1.2–1.8% by weight |
| C. | Monoethanolamine | 1.50–3.50% by weight |
| D. | Ethylene Glycol | 1.00–2.25% by weight |
| E. | Isopropyl Alcohol | 0.20–0.70% by weight |
| F. | Water | Balance to 100% by weight |

11. The developing solution of claim 10 additionally comprising 0%–0.2% by weight disodium ethylenediamine tetraacetic acid.

12. The developing solution of claim 10 additionally comprising 0%–1% by weight phloroglucinol.

13. A method of developing an imagewise-exposed layer of positive-working photoresist composition which comprises:

contacting said layer with an aqueous developing solution comprising:

| A. | Soluble Alkali Metal Phosphate | 1.50–3.00% by weight |
|---|---|---|
| B. | Soluble Alkali Metal Silicate | 1.00–2.00% by weight |
| C. | Mono (lower alkanol) amine | 0.40–5.00% by weight |
| D. | Soluble Alkylene Glycol | 0.25–3.00% by weight |
| E. | Lower Alkanol | 0.05–1.00% by weight |
| F. | Water | Balance to 100% by weight |

14. The method of developing of claim 13 wherein said aqueous developing solution additionally comprises 0%–0.2% by weight disodium ethylenediamine tetraacetic acid.

15. The method of developing of claim 13 wherein said aqueous developing solution additionally comprises 0%–0.1% by weight phloroglucinol.

16. The method of developing of claim 13 wherein said contacting step is carried out by immersing said layer in a bath of said developing solution.

17. The method of developing of claim 13 wherein said aqueous developing solution comprises:

| A. | Trisodium phosphate | 1.80–2.50% by weight |
|---|---|---|
| B. | Sodium Metasilicate | 1.2–1.8% by weight |
| C. | Monoethanolamine | 1.50–3.50% by weight |
| D. | Ethylene Glycol | 1.00–2.25% by weight |
| E. | Isopropyl Alcohol | 0.20–0.70% by weight |
| F. | Water | Balance to 100% by weight |

* * * * *